(12) United States Patent
Tu et al.

(10) Patent No.: US 10,416,225 B2
(45) Date of Patent: Sep. 17, 2019

(54) DETECTION METHOD FOR LIGHT EMITTING DIODE CHIP

(71) Applicant: ADVANCED OPTOELECTRONIC TECHNOLOGY, INC., Hsinchu Hsien (TW)

(72) Inventors: Po-Min Tu, Hsinchu (TW); Tzu-Chien Hung, Hsinchu (TW); Chia-Hui Shen, Hsinchu (TW); Chien-Shiang Huang, Hsinchu (TW); Chien-Chung Peng, Hsinchu (TW); Ya-Wen Lin, Hsinchu (TW); Ching-Hsueh Chiu, Hsinchu (TW)

(73) Assignee: ADVANCED OPTOELECTRONICS TECHNOLOGY INC., Hsinchu Hsien (TW)

( * ) Notice: Subject to any disclaimer, the term of this patent is extended or adjusted under 35 U.S.C. 154(b) by 0 days.

(21) Appl. No.: 15/824,601

(22) Filed: Nov. 28, 2017

(65) Prior Publication Data

US 2019/0128951 A1    May 2, 2019

(30) Foreign Application Priority Data

Oct. 30, 2017  (CN) .......................... 2017 1 1039233

(51) Int. Cl.
| | |
|---|---|
| *G01R 31/26* | (2014.01) |
| *H01L 33/20* | (2010.01) |
| *H01L 33/00* | (2010.01) |
| *H01L 33/36* | (2010.01) |
| *H01L 33/48* | (2010.01) |
| *H01L 25/075* | (2006.01) |
| *H01L 23/00* | (2006.01) |
| *H01L 33/62* | (2010.01) |

(52) U.S. Cl.
CPC .......... *G01R 31/2635* (2013.01); *H01L 24/92* (2013.01); *H01L 25/0753* (2013.01); *H01L 33/005* (2013.01); *H01L 33/0008* (2013.01); *H01L 33/20* (2013.01); *H01L 33/36* (2013.01); *H01L 33/483* (2013.01); *H01L 33/62* (2013.01); *H01L 2933/0016* (2013.01); *H01L 2933/0025* (2013.01)

(58) Field of Classification Search
CPC ........... H01L 33/005; H01L 2933/0008; H01L 24/95; H01L 25/50; H01L 25/167; H01L 25/0753; H01L 27/1259; H01L 25/165
See application file for complete search history.

(56) References Cited

U.S. PATENT DOCUMENTS

| | | | |
|---|---|---|---|
| 7,687,277 B2* | 3/2010 | Sharma | H01L 24/86 436/174 |
| 2007/0224713 A1* | 9/2007 | Han | H01L 24/95 438/26 |
| 2017/0062492 A1* | 3/2017 | Bae | H01L 27/1259 |

* cited by examiner

*Primary Examiner* — Thanh Y. Tran
(74) *Attorney, Agent, or Firm* — ScienBiziP, P.C.

(57) ABSTRACT

A detection method for an LED chip comprising the following steps: providing a container with a solvent therein, and putting the LED chips in the container to mix the LED chips with the solvent; providing a base with a circuit therein, the base forms a plurality of receiving holes, a bottom of each receiving holes have an N electrode and a P electrode coupled with the circuit; transferring the solvent and the LED chip mixed in the solvent on the base; detecting the LED chip received in the receiving holes; providing a carrier film and classifying the LED chips on the carrier film.

11 Claims, 3 Drawing Sheets

DETECTION METHOD FOR LIGHT EMITTING DIODE CHIP

CROSS-REFERENCE TO RELATED APPLICATIONS

This application claims priority to Chinese Patent Application No. 201711039233.2 filed on Oct. 30, 2017, the contents of which are incorporated by reference herein.

FIELD

The subject matter herein generally relates to a detection method, especially relates to a detection method for a light emitting diode chip.

BACKGROUND

Generally, an LED (light emitting diode) chip with high brightness, long life, energy conservation and environment protection is widely used in lighting area and display area.

While the LED chip is used in display area, the LED chip is always used as a backlight module in a display device. Nowadays, with the development of the display device, a size of the display device is more and more smaller, so a smaller size of LED chip is also needed to used in the display device. However, because of a smaller size of the LED chip, while the LED chip is manufactured, a detection method for the LED chip to ensure a good quality of the LED chip is needed and difficult.

BRIEF DESCRIPTION OF THE DRAWINGS

Implementations of the present technology will now be described, by way of example only, with reference to the attached figures.

DETAILED DESCRIPTION OF EMBODIMENTS

It will be appreciated that for simplicity and clarity of illustration, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts have been exaggerated to better illustrate details and features of the present disclosure. The description is not to be considered as limiting the scope of the embodiments described herein.

Several definitions that apply throughout this disclosure will now be presented. The term "comprising" means "including, but not necessarily limited to"; it specifically indicates open-ended inclusion or membership in a so-described combination, group, series and the like. The term "coupled" is defined as connected, whether directly or indirectly through intervening components, and is not necessarily limited to physical connections. The connection can be such that the objects are permanently connected or releasably connected.

Figure 1:
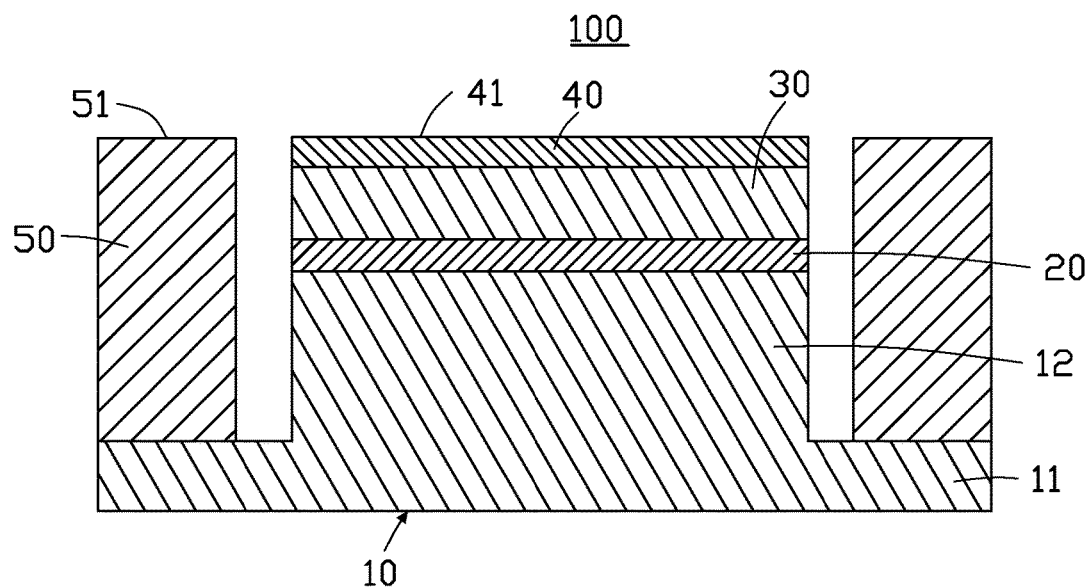
FIG. 1 is a cross sectional view of an LED chip of the present disclosure.

Referring to FIG. 1, a LED chip 100 of the present disclosure includes a first semiconductor layer 10, a light active layer 20 formed on the first semiconductor layer 10, a second semiconductor layer 30 formed on the light active layer 20, a first electrode 40 formed on the second semiconductor layer 30, and a second electrode 50 formed on the first semiconductor 10.

In the exemplary embodiment, the first semiconductor layer 10 is an N type semiconductor layer, the second semiconductor layer 30 is a P type semiconductor layer.

The first semiconductor layer 10 includes a main portion 11 and a extending portion 12 extended from a center of a top surface of the main portion 11. The extending portion 12 is perpendicular to the top surface of the main portion 11.

The light active layer 20, the second semiconductor layer 30 and the first electrode 40 are in order formed on the extending portion 12. The second electrode 50 is formed on periphery of the main portion 11. A outer periphery of the light active layer 20, an outer periphery of the second semiconductor layer 30 and an outer periphery of the first electrode 40 are coplanar with an outer periphery of the extending portion 12. An outer periphery of the second electrode 50 is coplanar with an outer periphery of the main portion 11.

Further, the first electrode 40 has a first top surface 41. The second electrode 50 has a second top surface 51. The first top surface 41 and the second top surface 51 are located on the same horizontal plane.

Figure 2:
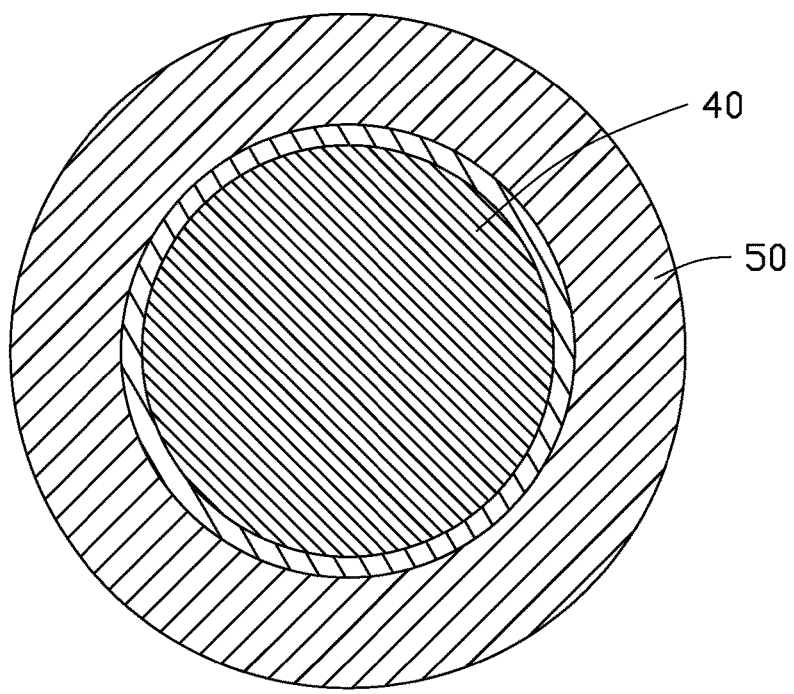
FIG. 2 is a top view of the LED chip of FIG. 1.

Also referring to FIG. 2, a top view of the LED chip 100 of the present disclosure presents two concentric circles.

Figure 3:
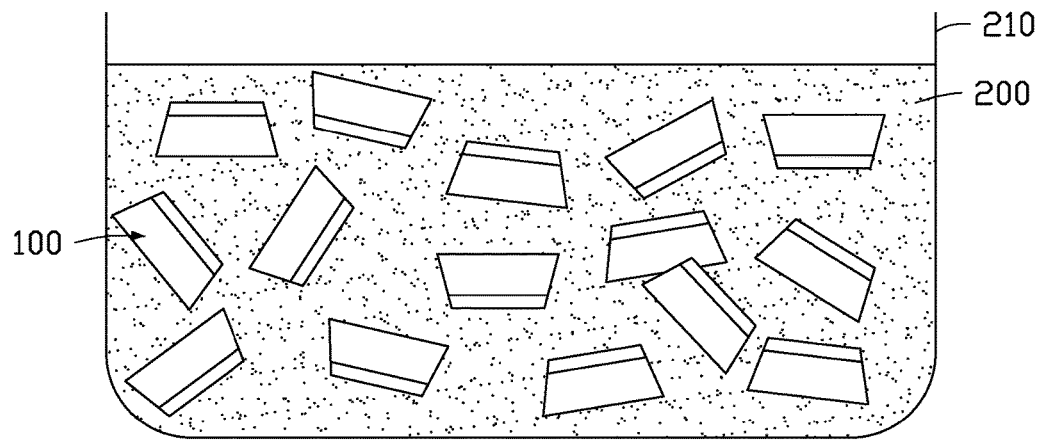
FIGS. 3-7 are diagrams of a detection method for the LED chip of the present disclosure.

FIGS. 3-7 illustrate a detection method for the LED chip 100 of the present disclosure. In the detection method illustrated in FIGS. 3-7, the specific structure of the LED chip 100 is ignored and uses schematic diagram. The detection method for the LED chip 100 includes the following steps:

First, referring to FIG. 3, providing a container 210 with a solvent 200 therein, and putting the LED chips 100 in the container 210 to mix the LED chips 100 with the solvent 200.

The solvent 200 includes IPA (IsoPropyl Alcohol) and an organic matter having a viscous coefficient more than that of IPA.

Figure 4:
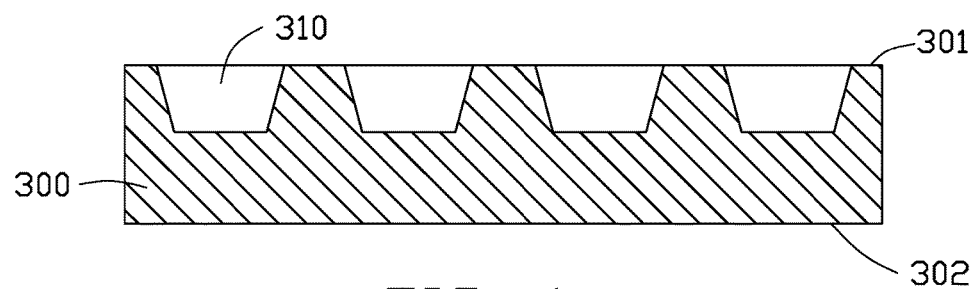

Second, referring to FIG. 4, providing a base 300 with a circuit (not showed in FIGS.) therein, the base 300 forms a plurality of receiving holes 310, a bottom of each receiving holes 310 have a N electrode (not showed in FIGS.) and a P electrode (not showed in FIGS.) coupled with the circuit.

The base 300 has a first surface 301 and a second surface 302 opposite to the first surface 301. A longitudinal section of each receiving holes 310 is trapezoidal. A diameter of each receiving hole 310 decreases from the first surface 301 to the second surface 302 of the base 300. An outline of each receiving holes 310 is corresponding to the LED chip 100. The first electrode 40 and the second electrode 50 of the LED chip 100 are coupled with the N electrode and the P electrode of the base 300 for detecting electrical parameters of the LED chip 100.

Figure 5:
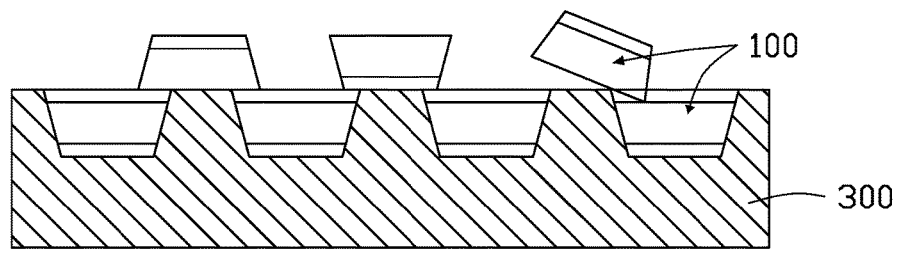

Referring to FIG. 5, transferring the solvent 200 and the LED chip 100 mixed in the solvent 200 on the base 300.

A method for transferring the solvent 200 and the LED chips 100 mixed in the solvent 200 on the base includes spray, coating or scour. After transferring the solvent 200 and the LED chip 100 mixed in the solvent 200 on the base 300, part of the LED chips 100 are on the first surface 301, and part of the LED chips 100 are received in the receiving holes 310.

Figure 6:
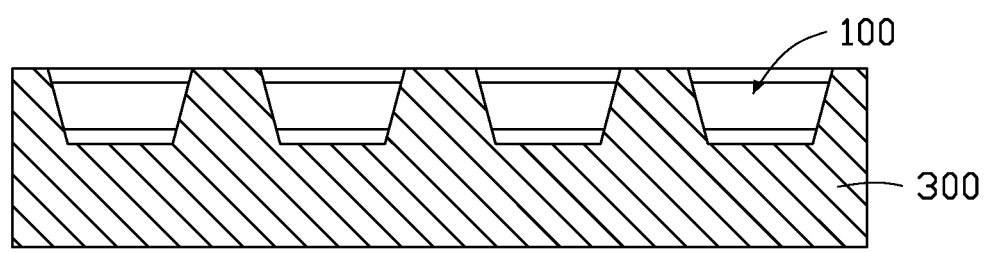

Fourth, referring to FIG. 6, removing the LED chips 100 located on the first surface 301 from the base 300 and detecting the LED chip 100 received in the receiving holes 310.

A method for removing the LED chips 100 located on the first surface 301 from the base 300 includes trasonic vibration, mechanical vibration or electromagnetic vibration etc. Detecting the LED chip received in the receiving holes 310 is by electrical test or light intensity test.

Figure 7:
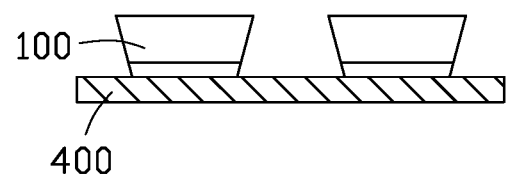

Fifth, referring to FIG. 7, providing a carrier film 400 and classifying the LED chips 100 on the carrier film 400.

In the process of the detection method for the LED chips 100 of the present disclosure, the LED chips 100 is classified according to a electronic test or light intensity test to ensure a good quality of the LED chips 100.

The embodiments shown and described above are only examples. Many details are often found in the art such as the other features of a detecting method for LED chip. Therefore, many such details are neither shown nor described. Even though numerous characteristics and advantages of the present technology have been set forth in the foregoing description, together with details of the structure and function of the present disclosure, the disclosure is illustrative only, and changes can be made in the detail, including in matters of shape, size and arrangement of the parts within the principles of the present disclosure up to, and including the full extent established by the broad general meaning of the terms used in the claims. It will therefore be appreciated that the embodiments described above can be modified within the scope of the claims.

What is claimed is:

1. A detection method for LED chips comprising the following steps:
   providing a container with a solvent therein, and putting the LED chips in the container to mix the LED chips with the solvent;
   providing a base with a circuit out of the container, the base forms a plurality of receiving holes;
   transferring the solvent and the LED chips mixed in the solvent on the base;
   electrically connecting the LED chips received in the receiving holes to the circuit to detect the LED chips received in the receiving holes;
   providing a carrier film and classifying the LED chips on the carrier film;
   wherein each LED chip comprises a first semiconductor layer, a light active layer formed on the first semiconductor layer, a second semiconductor layer formed on the light active layer, a first electrode formed on the second semiconductor layer, and a second electrode formed on the first semiconductor layer, the first semiconductor layer comprises a main portion and an extending portion extended from a center of a top surface of the main portion; the first electrode has a first top surface, the second electrode has a second top surface, and the first top surface and the second top surface are located on the same horizontal plane.

2. The detection method for the LED chips of claim 1, wherein the base has a first surface and a second surface opposite to the first surface.

3. The detection method for the LED chips of claim 2, wherein a longitudinal section of each receiving holes is trapezoidal, a diameter of each receiving hole decreases from the first surface to the second surface of the base, and each receiving hole is corresponding to each LED chip.

4. The detection method for the LED chips of claim 2, wherein an outline of each receiving hole is corresponding to that of each LED chip, the first electrode and the second electrode of each LED chip are coupled with the circuit for detecting electrical parameters of each LED chip.

5. The detection method for the LED chips of claim 4, wherein the first electrode and the second electrode of each LED chip are coupled with electrodes defined on a bottom of each receiving holes.

6. The detection method for the LED chips of claim 2, wherein before detecting the LED chips received in the receiving holes, the detection method for the LED chips also comprises removing the LED chips located on the first surface from the base.

7. The detection method for the LED chips of claim 2, a method for transferring the solvent and the LED chips mixed in the solvent on the base comprises spray, coating or scour.

8. The detection method for the LED chips of claim 2, wherein a method for removing the LED chips located on the first surface from the base comprises transonic vibration, mechanical vibration or electromagnetic vibration, detecting the LED chips received in the receiving holes is by electrical test or light intensity test.

9. The detection method for the LED chips of claim 1, wherein the solvent comprises IPA (IsoPropyl Alcohol) and an organic matter having a viscous coefficient more than a viscous coefficient of IPA.

10. The detection method for the LED chips of claim 1, wherein the second semiconductor layer and the first electrode are in order formed on the extending portion, the second electrode is formed on periphery.

11. The detection method for the LED chips of claim 10, wherein an outer periphery of the light active layer, an outer periphery of the second semiconductor layer and an outer periphery of the first electrode are coplanar with an outer periphery of the extending portion, an outer periphery of the second electrode is coplanar with an outer periphery of the main portion.

* * * * *